(12) United States Patent
Huang

(10) Patent No.: US 11,871,620 B2
(45) Date of Patent: Jan. 9, 2024

(54) OLED DISPLAY PANEL HAVING FENCE STRUCTURE UNDER ANODE

(71) Applicant: SeeYa Optronics, Ltd., Shanghai (CN)

(72) Inventor: Zhongshou Huang, Shanghai (CN)

(73) Assignee: SeeYa Optronics, Ltd., Shanghai (CN)

( * ) Notice: Subject to any disclaimer, the term of this patent is extended or adjusted under 35 U.S.C. 154(b) by 0 days.

(21) Appl. No.: 17/332,313

(22) Filed: May 27, 2021

(65) Prior Publication Data

US 2022/0069036 A1   Mar. 3, 2022

(30) Foreign Application Priority Data

Aug. 25, 2020   (CN) .......................... 202010865376.4

(51) Int. Cl.
*H01L 27/32* (2006.01)
*H01L 51/50* (2006.01)
*H10K 59/122* (2023.01)
*H10K 50/15* (2023.01)

(52) U.S. Cl.
CPC ........... *H10K 59/122* (2023.02); *H10K 50/15* (2023.02)

(58) Field of Classification Search
CPC .................. H01L 27/3246; H01L 51/5056
See application file for complete search history.

(56) References Cited

U.S. PATENT DOCUMENTS

| | | | | |
|---|---|---|---|---|
| 2016/0149154 A1* | 5/2016 | Park | ..................... | H01L 51/5271 438/23 |
| 2017/0005286 A1* | 1/2017 | Yun | ......................... | H10K 59/35 |
| 2017/0301889 A1* | 10/2017 | Hayashida | .............. | H01L 51/56 |
| 2018/0190907 A1 | 7/2018 | Kim et al. | | |
| 2018/0358573 A1* | 12/2018 | Maeda | .................... | H10K 50/15 |
| 2021/0013279 A1* | 1/2021 | Lin | ....................... | H10K 50/818 |

FOREIGN PATENT DOCUMENTS

| | | | | | |
|---|---|---|---|---|---|
| CN | 13887443 | A | | 6/2014 | |
| CN | 107346778 | A | | 11/2017 | |
| CN | 107968106 | A | | 4/2018 | |
| CN | 108493228 | A | | 9/2018 | |
| CN | 109585662 | A | | 4/2019 | |
| CN | 109686768 | A | | 4/2019 | |
| CN | 110164907 | A | | 8/2019 | |
| CN | 110176478 | A | | 8/2019 | |
| CN | 110993678 | A | | 4/2020 | |
| CN | 111092111 | A | | 5/2020 | |
| JP | 2017-182912 | A | | 10/2017 | |
| TW | 201721857 | A | | 6/2017 | |
| WO | WO-2021217746 | A1 | * | 11/2021 | ......... H01L 27/3218 |

OTHER PUBLICATIONS

Chinese Office Action dated Apr. 2, 2022, in connection with Chinese Application No. 202010865376.4.

* cited by examiner

*Primary Examiner* — Peter Bradford
(74) *Attorney, Agent, or Firm* — Wolf, Greenfield & Sacks, P.C.

(57) ABSTRACT

An OLED panel includes a plurality of light-emitting elements, that each light-emitting element includes a fence structure on a substrate and in an opening of a pixel definition layer. A trench is formed between the fence structure and the pixel definition layer. Charge transport layer is disconnected at the trench by a shadowing effect of the fence structure during thermal evaporation of the charge transport layer. Therefore, lateral current leakage between two adjacent light-emitting elements is minimized.

12 Claims, 8 Drawing Sheets

OLED DISPLAY PANEL HAVING FENCE STRUCTURE UNDER ANODE

CROSS-REFERENCE TO RELATED APPLICATION(S)

This application claims foreign priority benefits under 35 U.S.C. § 119(a)-(d) or 35 U.S.C. § 365(b) of Chinese application number 202010865376.4, filed Aug. 25, 2020, the disclosure of which is incorporated herein by reference in its entirety.

TECHNICAL FIELD

The present disclosure relates to the field of display panels and, in particular, to an organic light-emitting diode (OLED) panel.

BACKGROUND

In recent years, OLED panels have gradually become the mainstream of screens of mobile display terminal. An OLED panel includes a plurality of sub-pixels disposed in an array. Each sub-pixel includes a pixel driving circuit and a light-emitting element electrically connected to the pixel driving circuit.

In the related art, each light-emitting element includes an organic multilayer sandwiched by an anode and a cathode, the organic multilayer includes a hole transport layer, a light-emitting layer, an electron transport layer that are stacked on the anode in evaporation sequence. In order to improve the display resolution or to manufacture a display panel in a relatively small silicon die, a white OLED formed by organic multilayer combined with RGB color filter becomes a viable solution, where the organic multiple layers are continuously deposited onto the OLED panel in a vacuum chamber without shadow mask, and a physical separation of adjacent sub-pixels is achieved by a pixel definition layer.

However, since the organic multilayer of the light-emitting elements extends across the whole pixel array continuously, a lateral leakage current occurs wherever a voltage difference exists between two adjacent sub-pixels. The lateral leakage current will reduce the signal voltage amplitude in each sub-pixel, and inevitably cause image blurring and color gamut decrease.

SUMMARY

The present disclosure provides an OLED panel, to reduce the lateral leakage current between adjacent sub-pixels and improve the OLED display resolution and color gamut accordingly.

An embodiment of the present disclosure provides an OLED panel, including a pixel array including a plurality of light-emitting pixels.

Each of the plurality of light-emitting pixels includes a substrate and a fence structure, a first electrode layer, a pixel definition layer, a first charge transport layer, a light-emitting layer, a second charge transport layer, and a second electrode layer that are stacked in process sequence.

The pixel definition layer includes an opening that exposes part of a first electrode, a vertical projection of the fence structure on the substrate is located inside a vertical projection of the opening area on the substrate. As a trench is formed between a sidewall of the fence structure and a sidewall of the opening area prior to the evaporation of the OLED multilayer, then the evaporated first charge transport layer may be discontinued in the trench, resulting from a shadowing effect of the fence structure.

Resulting from the shadowing effect, part of the material evaporated from a crucible or an evaporation source are blocked by the fence structure, so the formed first charge transport layer may be discontinued in the trench, and so does a lateral leakage current path between adjacent light-emitting pixels. Therefore, the display resolution and color gamut are improved accordingly.

DETAILED DESCRIPTION

Figure 1:
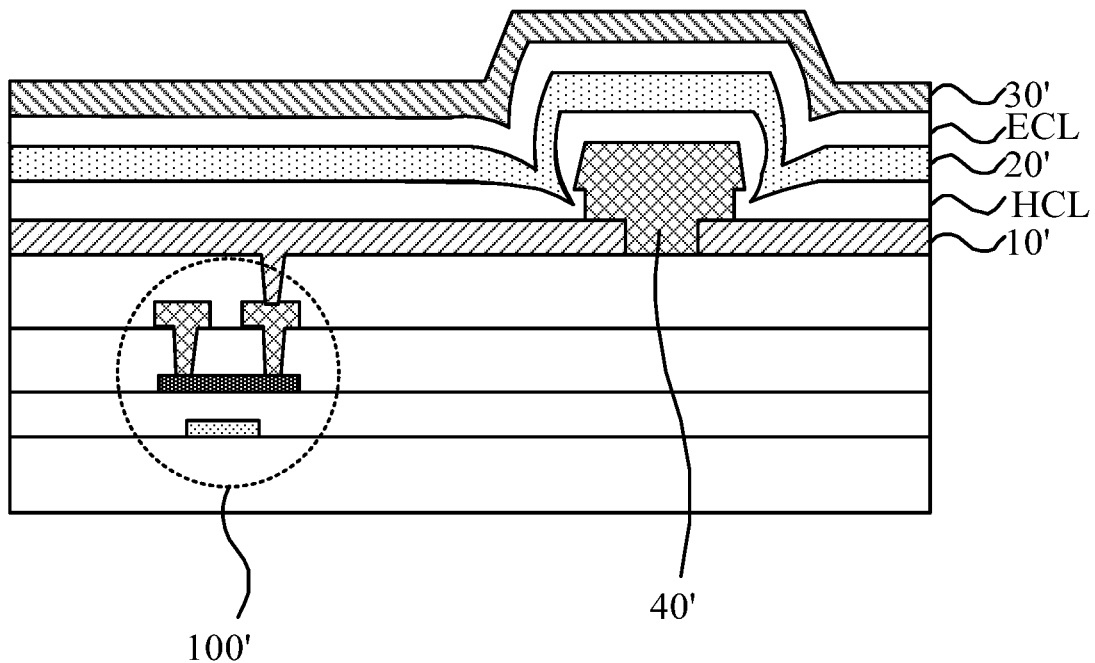
FIG. 1 shows a cross-sectional view of an OLED panel in the related art.

Hereinafter the present disclosure is described in detail in conjunction with the drawings and embodiments. It is to be understood that the embodiments set forth below are intended to illustrate and not to limit the present disclosure. In addition, it is to be noted that for ease of description, only part, not all, of the structures related to the present disclosure are illustrated in the drawings.

FIG. 1 shows a cross-sectional view of a typical OLED pixel structure. As shown in FIG. 1, the OLED panel includes a thin film transistor (TFT hereinafter) 100' for driving a sub-pixel, a pixel definition layer (PDL hereinafter) 40' disposed between two adjacent sub-pixels, an anode 10', a light-emitting layer 20' and a cathode 30'. A source terminal of the TFT 100' is connected to the anode 10' for providing a corresponding signal voltage to the OLED thin film in the subpixel. Assuming 1V signal voltage difference exists between two adjacent sub-pixels as indicated in FIG. 1. The light-emitting layer 20' is sandwiched by a hole conductive layer (HCL) and an electron conductive layer (ECL). The HCL may include a hole injection layer and a hole transport layer having high hole mobility and the ECL includes an electron injection layer and an electron transport layer having high electron mobility. The cathode 30' is disposed on the ECL and is connected to all OLED films of the sub-pixels of the OLED panel, and a protective layer and a color filter may be also disposed on the cathode 30'. A function of the color filter is to convert a white light emitted from the light-emitting layer 20' into three colors of red, green and blue. Light photons are isotropically emitted from the light-emitting layer 20' in all directions. The OLED panel shown in FIG. 1 is a top emission type in which the light photons are emitted upward in opposite of the substrate. This OLED panel structure combining one white OLED film and RGB filters allows manufacturer to avoid using three separate masks for evaporating RGB OLED films, and therefore brings benefits in high resolution display applications. However, the drawback is that lateral leakage current may occur whenever a voltage difference exists between two adjacent sub-pixels. The lateral leakage current will reduce the signal voltage in each sub-pixel, and inevitably cause image blurring and color gamut decrease.

Figure 2:
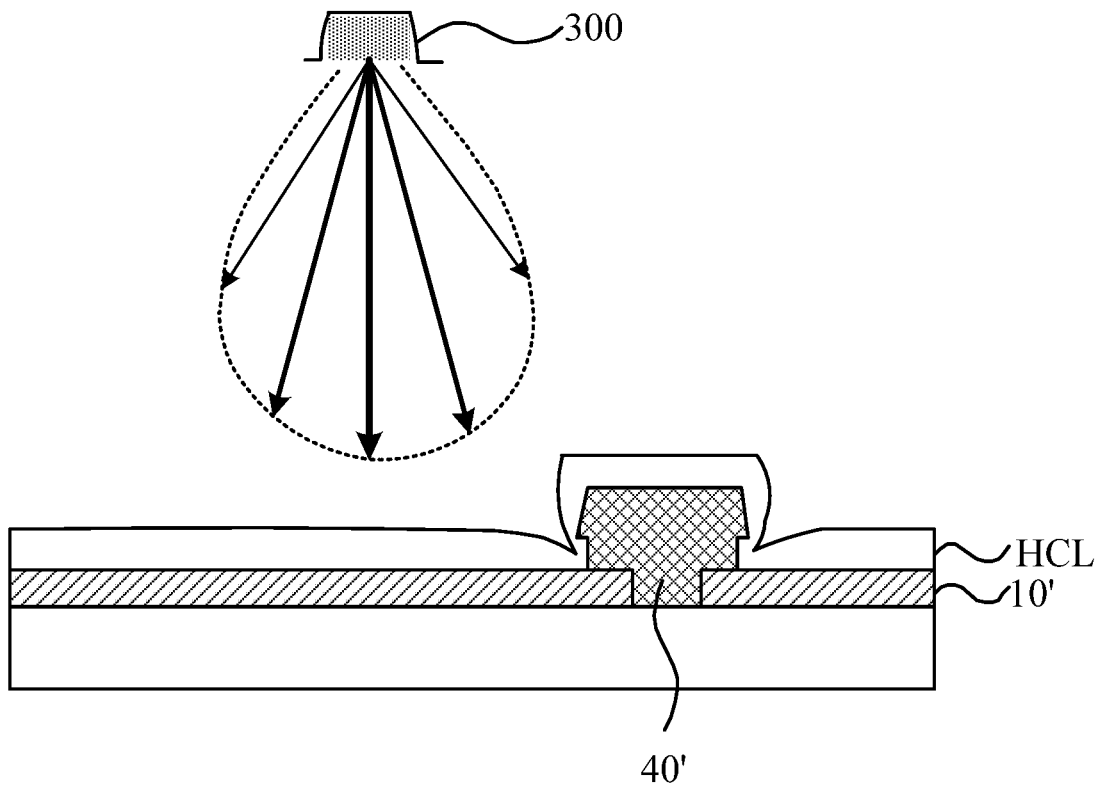
FIG. 2 shows a cross-sectional view of another OLED panel in the related art.

To solve this problem, in the related art, as shown in FIG. 1 and FIG. 2, the sidewall of the PDL 40' is configured to have an under-cut region or a bottom hollowed-out region, so that the HCL is discontinued or becomes thin enough on the sidewall that the lateral leakage current become negligible. However, this configuration of the PDL needs a complicated manufacturing process with relatively low repeatability and reproducibility. Moreover, still referring to FIG. 2, in an evaporation process of the OLED thin films, emission directions of molecules evaporated from a crucible or an evaporation source follow a cosine-like distribution. The spatial density of molecules exhibits a peak value in the direction perpendicular to the surface of crucible or the surface of evaporation source and gradually decreases as the direction angle increases. Some of the evaporated molecules are scattered back and diffuse along the surface after colliding with the substrate. As a result, some molecules will still be deposited on the sidewall of the PDL, even in the under-cut sidewall, thereby forming a continuous leakage current path. To completely discontinue the hole conductive layer, it is necessary to further increase a height of the PDL 40' or a slope of its sidewall or a depth of the under-cut region. These excessive tailoring on surface topology, however, may cause cracking in top cathode metal layer 30', and further complicate film deposition and etching processes which lead to worse product reliability.

In addition to the aforementioned difficulties, large deposition area will make things worse. On a large OLED panel, a center and an edge of the substrate have different evaporation angles respect to the center of the crucible, resulting in non-uniform film thickness and various step coverages on the sidewall.

All the measures described above will lead to variability in structure of the OLED films on the sidewalls of the PDLs and poor repeatability and reproducibility of characteristics of the OLED films. The repeatability here refers to a probability in which the sub-pixels on the same substrate have quite similar characteristics, and the reproducibility here refers to a probability in which OLED films produced in different time periods or in different batches have quite similar characteristics. To solve this dilemma, it is desirable to provide a structure that not only effectively disconnect a specified layer such as the hole conductive layer of the OLED at the sidewall of PDL, but also has high repeatability and reproducibility in terms of OLED panel performance.

In the following, embodiments of the present disclosure of OLED panel are provided to tackle the technical problems aforementioned. Each OLED panel in the embodiments includes a pixel array comprising a plurality of light-emitting elements. Each light-emitting element includes a substrate and a fence structure, a first electrode layer, a PDL, a first charge transport layer, a light-emitting layer, a second charge transport layer, and a second electrode layer that are stacked in the process sequence. The PDL includes an opening that exposes part of a first electrode. A vertical projection of the fence structure on the substrate is located inside a vertical projection of the opening on the substrate. After a sidewall of the fence structure is covered by the first electrode layer, a trench is formed between the sidewall of the fence structure and a sidewall of the opening. When a thermal evaporation process is used for forming the OLED film, the number of molecules evaporated from the crucible or the evaporation source follows a cosine-like spatial distribution, that a spatial density of the molecules exhibits a peak value in the direction perpendicular to the surface of the crucible or the surface of the evaporation source and gradually decreases as the direction angle increases. Due to a shadowing effect, molecules emitted from the crucible at large angles are likely blocked at the trench location by the fence structure and the PDL, that only a small number of molecules could land on the sidewall of the fence structure and the PDL at the trench location, thereby minimizing lateral leakage current. It is anticipated based upon the structure concept disclosed herein, as long as the trench is deep and narrow enough, the sidewall of the PDL does not need to be deliberately processed for creating a discontinued first charge transport layer, which significantly simplifies the manufacture process and therefore increases the reliability of OLED panel.

Figure 3:
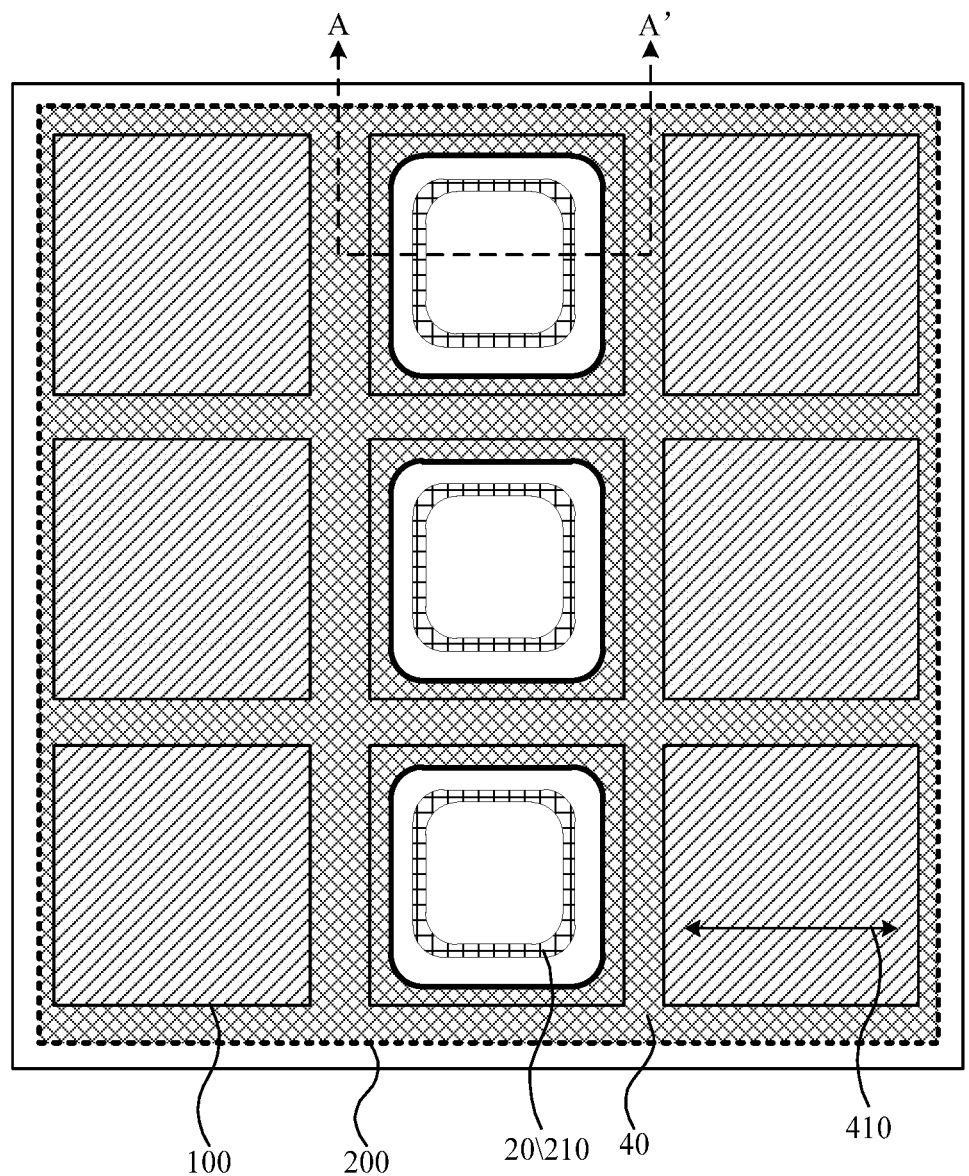
FIG. 3 shows a plane view of an OLED panel according to embodiments of the present disclosure.
Figure 4:
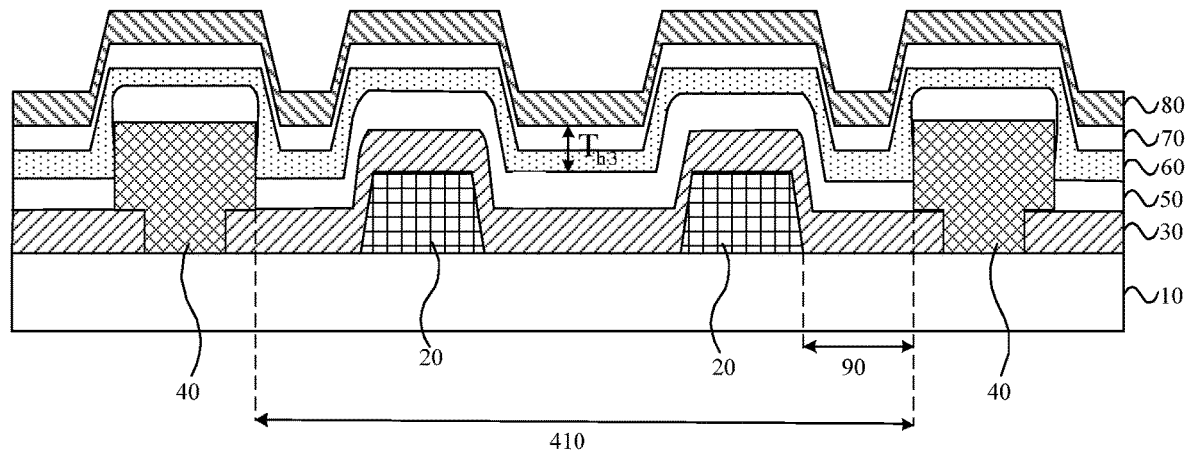
FIG. 4 shows a cross-sectional view of the OLED panel a line AA' in FIG. 3.
Figure 5:
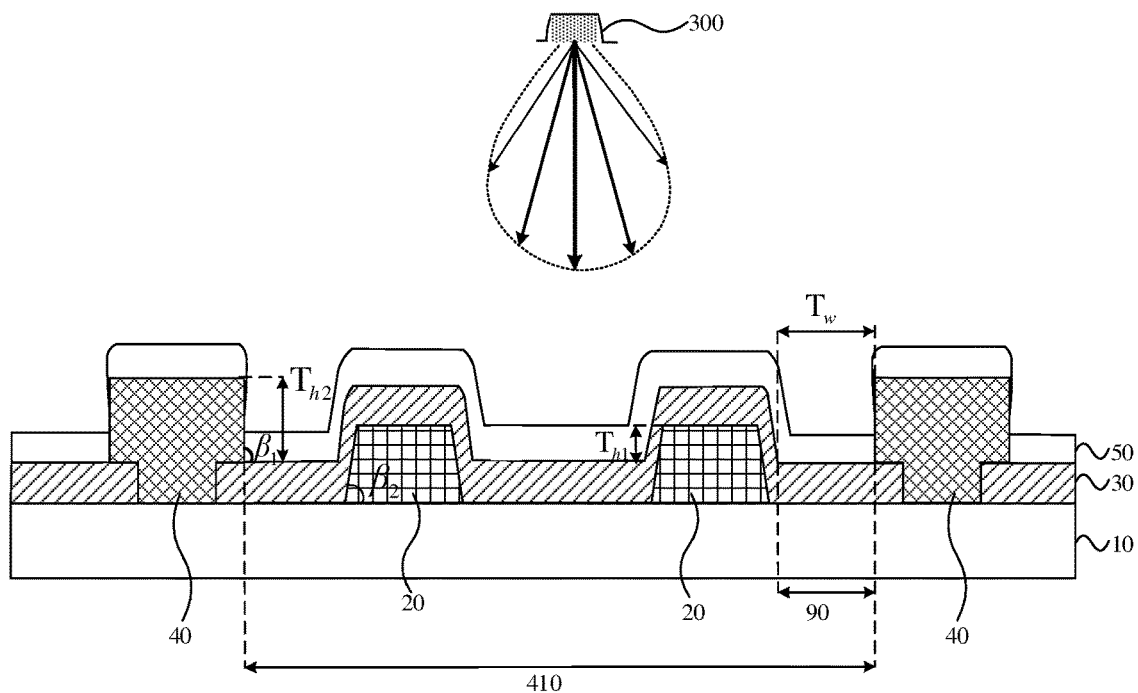
FIG. 5 shows a portion of the cross-sectional view illustrated in FIG. 4 with evaporation crucible.

FIG. 3 shows a plane view of an OLED panel according to embodiments of the present disclosure, FIG. 4 shows a cross-sectional view of the OLED panel along line AA' in FIG. 3, and FIG. 5 shows a portion of the cross-sectional view illustrated in FIG. 4 with an evaporation crucible. In conjunction with FIGS. 3-5, the OLED panel includes a pixel array 200 including a plurality of light-emitting elements 100. Each light-emitting element 100 includes a substrate 10 and a fence structure 20, a first electrode layer 30, a PDL 40, a first charge transport layer 50, a light-emitting layer 60, a second charge transport layer 70 and a second electrode layer 80 that are stacked in process sequence. The PDL 40 includes an opening 410 that exposes part of the first electrode layer 30, and a vertical projection of the fence structure 20 on the substrate 10 is located inside a vertical projection of the opening 410 on the substrate 10. After a sidewall of the fence structure 20 is covered by the first electrode layer 30, a trench 90 is formed between the sidewall of the fence structure 20 and a sidewall of the opening 410.

As shown in FIGS. 4 and 5, due to the shadowing effect, some molecules are blocked by the fence structure 20 as they are emitted from the crucible or the evaporation source 300, that the first charge transport layer 50 may be discontinuous in the trench 90, and thereby the lateral leakage current path between adjacent light-emitting elements 100 is discontinued. Therefore, the display resolution and color gamut are improved accordingly.

Now still referring to FIG. 5, wherein $T_W$ denotes a width of the trench 90, $T_{h1}$ denotes a depth of the trench 90 on one side of the fence structure 20, in at least one embodiment of the present disclosure that a ratio of $T_{h1}$ to $T_W$ satisfies the equation arc tg $(T_{h1}/t_W) \geq 25°$, for creating an effective shadowing effect during OLED material deposition. It is noted from FIG. 5 that $T_{h1}$ is substantially equal to the height of the fence structure laid on the first electrode layer.

In the embodiments described above, the thickness of the first charge transport layer deposited on the sidewall of the PDL 40 can be well modified by the $T_{h1}$ to $T_W$ ratio, from a very thin layer to essentially no material attached on the sidewall of the PDL 40. Compared with the prior art approach of creating an undercut in certain shape on the sidewall of PDL, controlling the trench depth to its width ratio relies only on conventional lithography and etching processes, providing huge benefits in process capability and reliability of the OLED panel.

Another geometric factor of the sidewall of the PDL $\beta_1$ is shown in FIG. 5, which represents a slope angle of a sidewall of the opening 410 from the plane surface of the first electrode layer 30. The inventor has conceived that within a certain range that $70° \leq \beta_1 \leq 110°$ in another embodiment of the present disclosure, the charge transport layer 50 becomes essentially discontinued on the sidewall of the PDL 40. Therefore, the lateral leakage current between adjacent light-emitting elements can be eliminated by keeping the slope angle within the aforementioned range and with wide variety of the trench depth to width ratio.

Still referring to FIGS. 4 and 5, $T_{h1}$ denotes the depth of the trench 90 on the side of the fence structure 20, $T_{h2}$ denotes a depth of the trench on a side of the PDL 40, $T_{h3}$ denotes a total thickness of materials between the first electrode layer 30 and the second electrode layer 80 at the bottom of the trench 90, in at least one embodiment of the present disclosure that $T_{h1}$, $T_{h2}$ and $T_{h3}$ satisfy equations $T_{h1} > T_{h3}$, $T_{h2} > T_{h3}$ and $T_{h2} > T_{h1}$.

Among the three relationships given above, a primary reason to keep $T_{h1}$ smaller than $T_{h2}$, is to ensure a continuity of the second electrode layer 80 above the PDL layer, which will keep OLED light emitting elements in all pixels biased by one external voltage source.

In another embodiment, still referring to FIG. 5, a second angle $\beta_2$ represents a slope angle of the sidewall of the fence structure 20 and satisfies equation $0 \leq \beta_2 \leq 80°$. The primary object of this condition, is to ensure the continuity of the light-emitting element particularly the second electrode layer 80 formed above the fence structure 20 and within the trench 90.

In another embodiment, the fence structure 20 includes a conductive material. This configuration provides a guarantee for conductivity of the first electrode inside each pixel, in case that the first electrode layer 30 formed on the sidewall of the fence structure 20 becomes highly resistive caused by film cracking resulting from film internal stress, or missing metal material resulting from the shadowing effect. The conductive material in the fence structure 20 includes chromium or silver, or any material with some conductivity.

In order to completely insulate any two adjacent pixels in the first charge transport layer, a ring-shaped fence structure, as illustrated in FIG. 3, FIG. 4 and FIG. 5, is used in one embodiment of the present disclosure. In this case, the ring-shaped fence structure is arranged parallel to the sidewall of the PDL opening while kept in an equal distance from the sidewall of the PDL.

Figure 6:
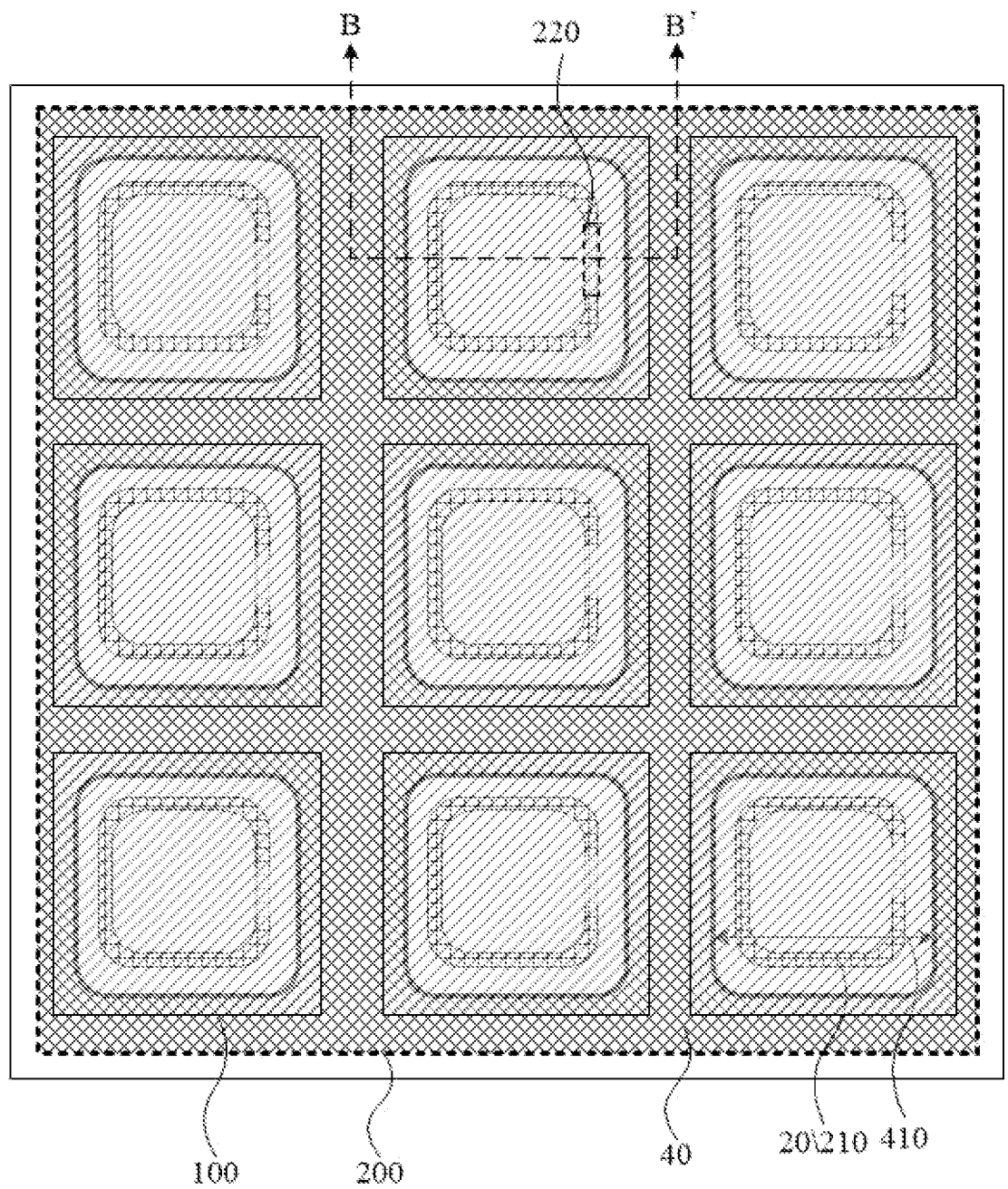
FIG. 6 shows a plane view of another OLED panel according to embodiments of the present disclosure.
Figure 7:
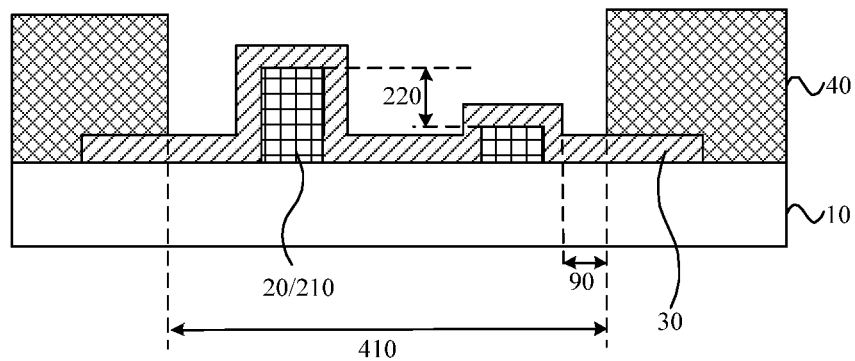
FIG. 7 shows a cross-sectional view in line BB' in FIG. 6.

In one of varieties of the ring-shape fence structure utilized in the embodiment of the present disclosure, at least one notch is made on the ring-shaped fence structure, as illustrated in FIG. 6 and FIG. 7, where FIG. 6 illustrates a plane view and FIG. 7 illustrates a cross-sectional view in line B-B' in FIG. 6. Such a structure is provided to ensure continuity of the first charge transport layer 50 while it climbing up the sidewall of the ring-shaped fence, and therefore to ensure that the light-emitting element enclosed by the ring-shaped fence can emit light as normal. To ensure the functionality of this notch against various process variations, the depth of the notch 220 is preferred to be larger than 25% of the height of the fence structure 20.

It is to be noted that a fence structure with a plurality of the notches is conceivable based on the concept described herein, the number of the notches 220 on the fence structure 20 is therefore not specifically limited in the embodiments of the present disclosure.

Figure 8:
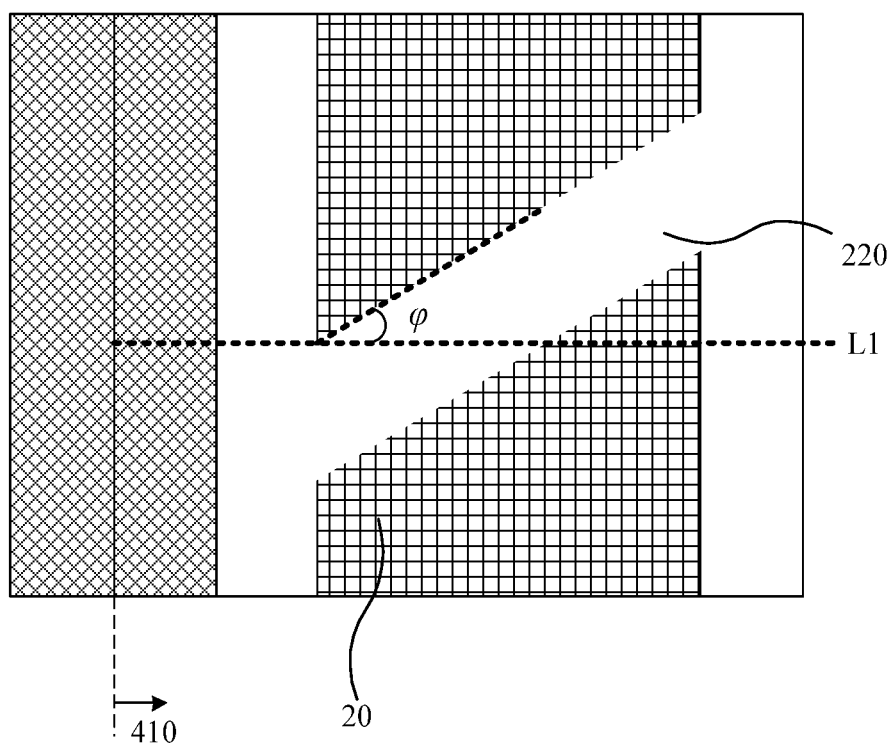
FIG. 8 shows a plane view of a notch of a fence structure according to embodiments of the present disclosure.

In one embodiment, as shown in FIG. 8, an angle between a projection of a pathway of the notch 220 on the substrate and a projection of the sidewall of the opening 410 on the substrate is substantially less than 90 degrees. More specifically, an angle between the pathway of the notch 220 and a straight line perpendicular to the sidewall of the opening 410 is configured to be less than 90 degrees. When the first charge transport layer is formed by means of evaporation, the fence structure effectively prevents molecules from being attached to the sidewall of the PDL, while the notch ensures continuity of the light-emitting layer.

Figure 9:
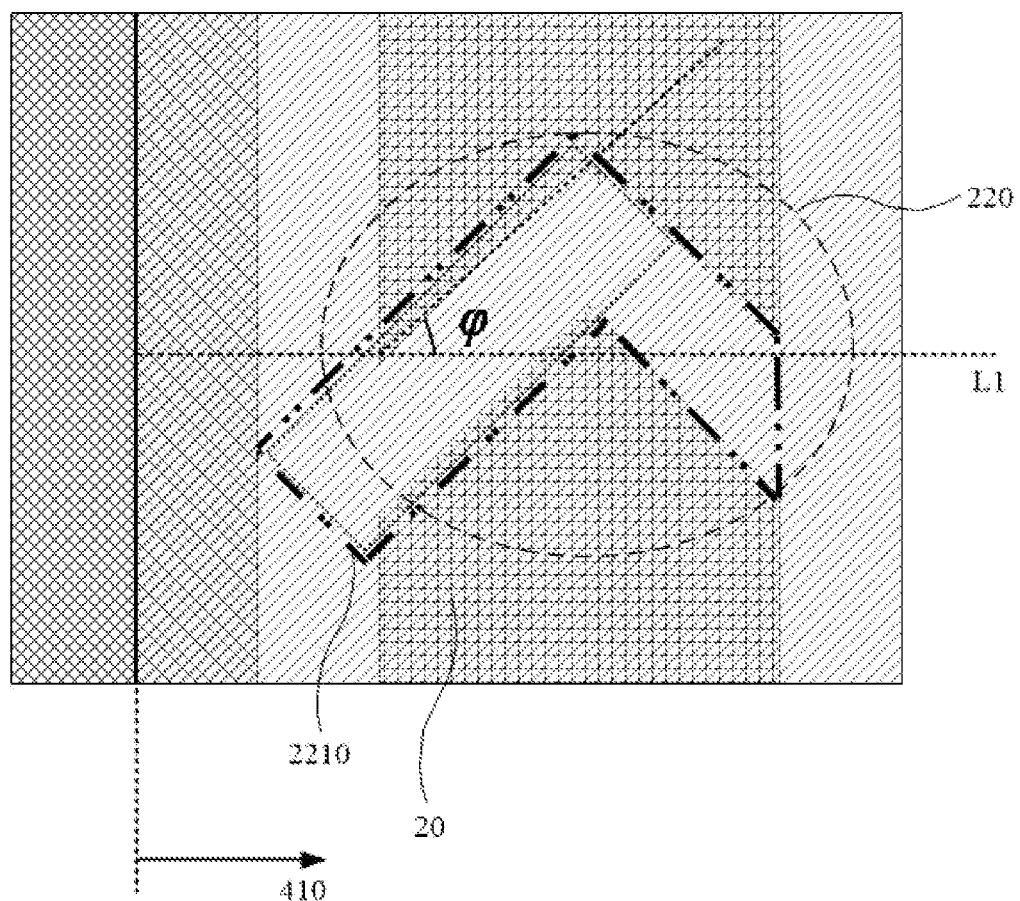
FIG. 9 shows a plane view of another notch of a fence structure according to embodiments of the present disclosure.

In one embodiment, as shown in FIG. 9, the pathway of the notch 220 includes a zigzag path 2210 that any straight line from the sidewall of the opening 410 is unable to go through. Equivalently, any straightly flying molecules from crucible are unable to pass the zigzag path 2210 and reach the sidewall of the PDL opening. In addition to the zigzag path plotted in FIG. 9, which is formed by two straight lines, more complicated or twisted path can be conceived and implemented into embodiments of the present disclosure, based on the zigzag path concept disclosed herein.

Figure 10:
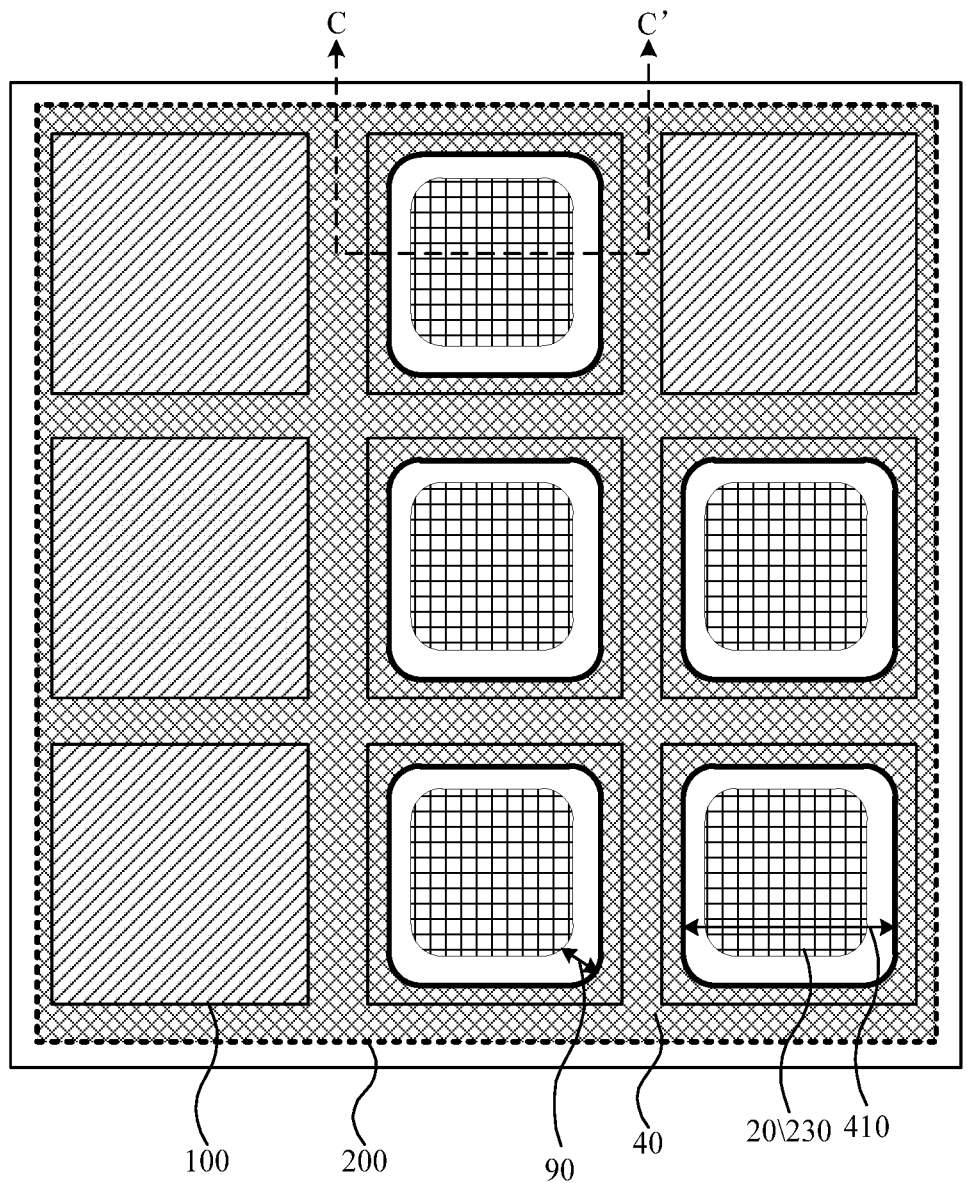
FIG. 10 shows a plane view of another OLED panel according to embodiments of the present disclosure.
Figure 11:
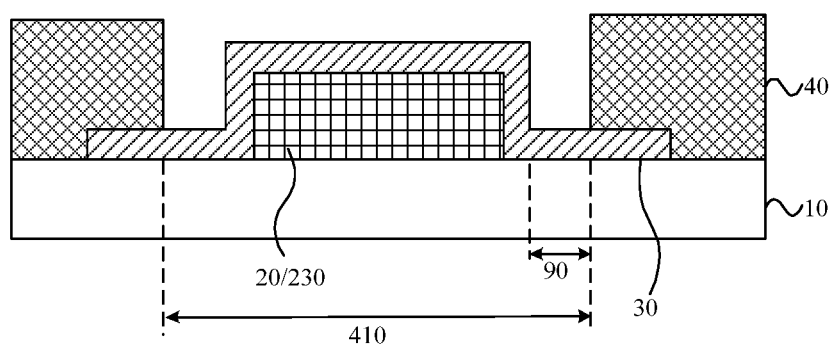
FIG. 11 shows a cross-sectional view of the OLED panel illustrated in FIG. 10 along line CC'.

Now referring to FIG. 10 and FIG. 11, FIG. 10 shows a plane view of another embodiment of the present disclosure, FIG. 11 shows its cross-sectional view along line C-C' in FIG. 10. The fence structure 20 in this embodiment includes a plateau 230 with substantially equal distance to the sidewall of the PDL opening. The said equal distance is also referred hereinafter as the width of the trench between the fence structure and the PDL. In such way, when the substrate 10 is covered by the first electrode layer 30, the trench 90 is naturally formed between the plateau 230 and the sidewall of the PDL opening.

Figure 12:
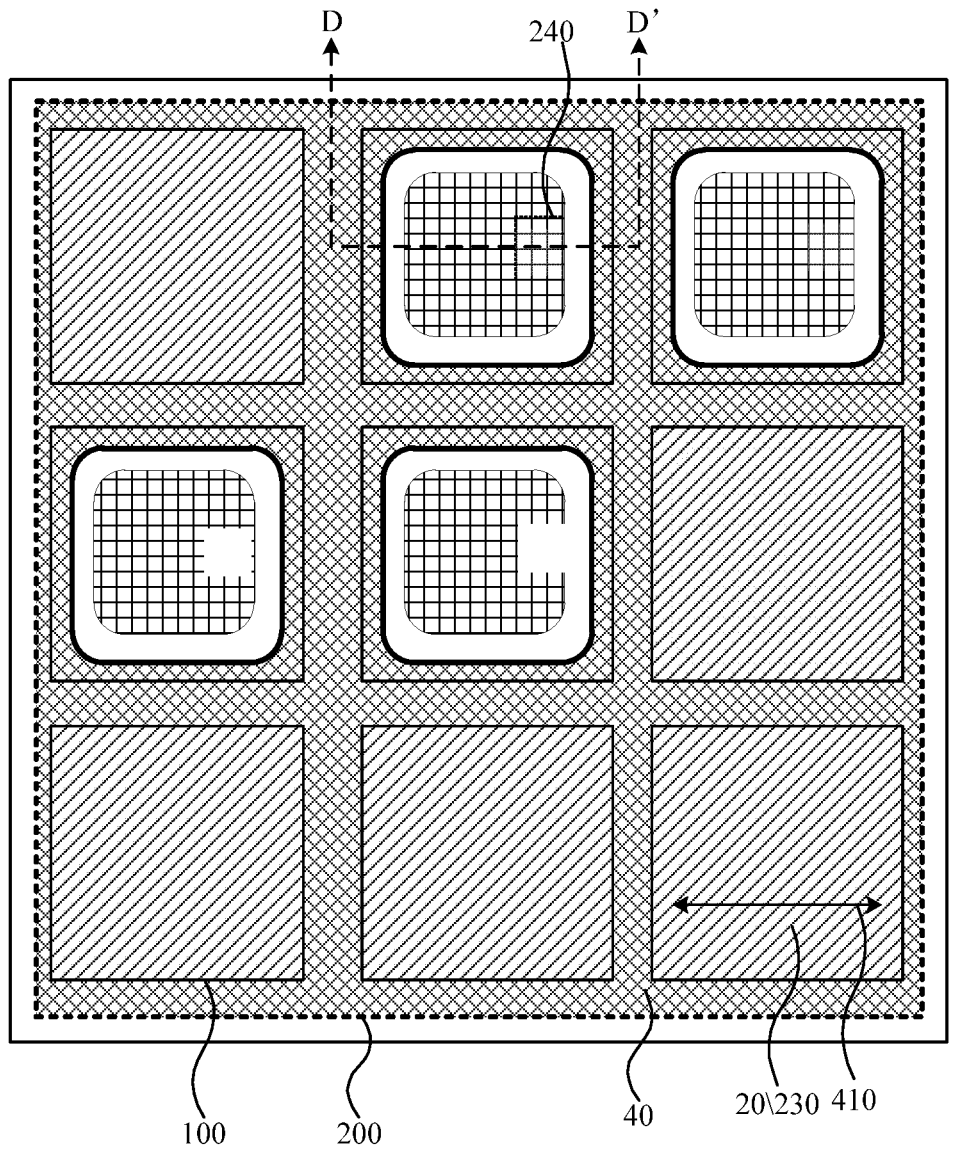
FIG. 12 shows a plane view of another OLED panel according to embodiments of the present disclosure.
Figure 13:
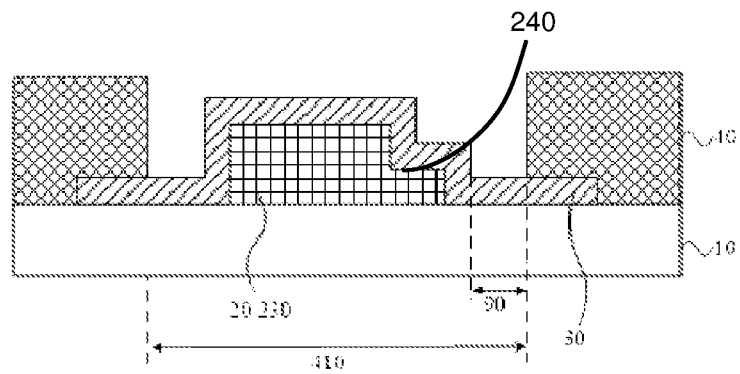
FIG. 13 shows a cross-sectional view of the OLED panel illustrated in FIG. 13 along line DD'.

FIG. 12 shows a plane view of another embodiment of the present disclosure, while FIG. 13 shows its cross-sectional view along line D-D' in FIG. 12. This embodiment is provided as an improvement from the embodiment in FIG. 10 and FIG. 11, for a better continuity of the multilayer stack from the first electrode layer to the second electrode layer, while it climbing up from the bottom of the trench to the plateau of the fence structure, A new structure, which is illustrated in FIG. 12 as a notch 240, and illustrated in FIG. 13 as a step, is added on to fence plateau 230 for this purpose. To further ensure a smooth crossing over on the fence structure, in at least one embodiment of the present disclosure that the depth of the notch is larger than 25% of the height of the plateau.

The above detailed descriptions of the embodiments of the present disclosure set forth preferred modes contemplated by the inventor for carrying out the present disclosure at the time of filing this application, and are provided by way of examples and not as limitations. Accordingly, various modifications and variations obvious to a person of ordinary skill in the art to which it pertains are deemed to lie within the scope and spirit of the present invention as set forth in the following claims.

What is claimed is:

1. An organic light-emitting diode (OLED) panel, comprising:
 a pixel array comprising a plurality of light-emitting elements; wherein
 each of the plurality of light-emitting elements comprises a fence structure, a first electrode layer, a pixel definition layer, a first charge transport layer, a light-emitting layer, a second charge transport layer, and a second electrode layer, that which are stacked on a substrate in sequence; and the pixel definition layer comprises an opening that exposes part of the first electrode layer; a vertical projection of the fence structure on the substrate is located inside a vertical projection of the opening on the substrate; a trench is formed between a sidewall of the fence structure and a sidewall of the opening, and the first charge transport layer comprises a discontinued portion in the trench;

wherein a vertical projection of the fence structure on the substrate exhibits a substantially ring shape, and the fence structure comprises at least one notch which has a depth larger than 25% of the height of the fence structure.

2. The OLED panel of claim 1, wherein geometric dimensions of the trench satisfy the equation arctangent $$\left(\frac{T_{h1}}{T_w}\right) \geq 25°,$$

where $T_W$ is a width of the trench and $T_{h1}$ is a depth of the trench on a side of the fence structure.

3. The OLED panel of claim 1, wherein the sidewall of the opening has a slope angle $\beta_1$ satisfying the equation $70° \leq \beta_1 \leq 110°$, wherein the slope angle $\beta_1$ is formed between the side wall of the opening and the first electrode layer and is subtended by the light-emitting layer.

4. The OLED panel of claim 1, wherein geometric dimensions of the light-emitting element satisfies the equations $T_{h1} > T_{h3}$, $T_{h2} > T_{h3}$, and $T_{h2} > T_{h1}$, where $T_{h1}$ is a depth of the trench on a side of the fence structure, $T_{h2}$ is a height from the first electrode layer to a top surface of the pixel definition layer, $T_{h3}$ is a total thickness of materials between the first electrode layer and the second electrode layer at a bottom of the trench, respectively.

5. The OLED panel of claim 1, wherein the sidewall of the fence structure has a slope angle $\beta_2$ satisfying the equation $0° \leq \beta_2 \leq 80°$, wherein the slope angle $\beta_2$ is formed between the side wall of the fence structure and the substrate and is subtended by the fence structure.

6. The OLED panel of claim 1, wherein the fence structure comprises a conductive material.

7. The OLED panel of claim 1, wherein a vertical projection of the fence structure on the substrate exhibits a substantially ring shape.

8. The OLED panel of claim 7, wherein the fence structure comprises at least one notch which has a depth larger than 25% of the height of the fence structure.

9. The OLED panel of claim 1, wherein an angle between a projection of a pathway of the notch on the substrate and a projection of the sidewall of the opening on the substrate is substantially less than 90 degrees.

10. The OLED panel of claim 1, wherein a projection of a pathway of the notch on the substrate comprises a zigzag path that substantially no straight line from the sidewall of the opening can pass through.

11. The OLED panel of claim 1, wherein the fence structure comprises a plateau and the trench width from the edge of the plateau to the sidewall of the opening remains substantially equal.

12. The OLED panel of claim 11, wherein the plateau comprises at least one notch which has a depth larger than 25% of a height of the plateau.

* * * * *